(12) United States Patent
Li

(10) Patent No.: US 12,167,589 B2
(45) Date of Patent: Dec. 10, 2024

(54) METHOD OF MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: Guangji Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 268 days.

(21) Appl. No.: 17/804,937

(22) Filed: Jun. 1, 2022

(65) Prior Publication Data

US 2023/0232615 A1 Jul. 20, 2023

Related U.S. Application Data

(63) Continuation of application No. PCT/CN2022/078996, filed on Mar. 3, 2022.

(30) Foreign Application Priority Data

Jan. 18, 2022 (CN) .......................... 202210052781.3

(51) Int. Cl.
*H01L 27/108* (2006.01)
*H10B 12/00* (2023.01)

(52) U.S. Cl.
CPC .......... *H10B 12/482* (2023.02); *H10B 12/30* (2023.02); *H10B 12/485* (2023.02)

(58) Field of Classification Search
CPC .... H10B 12/482; H10B 12/30; H10B 12/485; H10B 12/0335; H10B 12/315
See application file for complete search history.

(56) References Cited

U.S. PATENT DOCUMENTS 10,037,996 B2 7/2018 Kim et al.
10,361,209 B2 7/2019 Wang et al.
(Continued)

FOREIGN PATENT DOCUMENTS

CN 107611126 A 1/2018
CN 107845633 A 3/2018
(Continued)

OTHER PUBLICATIONS

International Search Report cited in PCT/CN2022/078996 mailed Oct. 10, 2022, 8 pages.

*Primary Examiner* — Mohammed R Alam
(74) *Attorney, Agent, or Firm* — Syncoda LLC; Feng Ma

(57) ABSTRACT

The present disclosure discloses a method of manufacturing a semiconductor structure and a semiconductor structure, and relates to the technical field of semiconductors. The method includes: providing a base, active regions arranged at intervals along a first direction being arranged in the base; forming, on the base, bit line structures arranged at intervals; forming a contact structure between two adjacent ones of the bit line structures; forming a barrier structure on the contact structure, the barrier structures being arranged in correspondence with and connected to the bit line structure, and a first recess being formed between any adjacent barrier structures; and forming a conductive structure in the first recess, the conductive structure including a protective layer and a conductive portion, and the protective layer wrapping a sidewall and a bottom wall of the conductive portion.

14 Claims, 7 Drawing Sheets

(56) References Cited

U.S. PATENT DOCUMENTS

| | | | |
|---|---|---|---|
| 11,374,010 B2 | 6/2022 | Tung et al. | |
| 2020/0203354 A1 | 6/2020 | Lee et al. | |
| 2023/0005924 A1* | 1/2023 | Park | H10B 12/34 |
| 2023/0171943 A1* | 6/2023 | Yang | H01L 28/90 |
| | | | 257/296 |

FOREIGN PATENT DOCUMENTS

| | | | | |
|---|---|---|---|---|
| CN | 108573926 B | | 1/2020 | |
| CN | 111463208 A | | 7/2020 | |
| CN | 111710679 A | * | 9/2020 | ....... H01L 27/10805 |
| CN | 113078115 A | | 7/2021 | |

* cited by examiner

METHOD OF MANUFACTURING SEMICONDUCTOR STRUCTURE AND SEMICONDUCTOR STRUCTURE

CROSS-REFERENCE TO RELATED APPLICATIONS

This is a continuation of International Application No. PCT/CN2022/078996, filed on Mar. 3, 2022, which claims the priority to Chinese Patent Application No. 202210052781.3, titled "METHOD OF MANUFACTURING SEMICONDUCTOR STRUCTURE AND SEMICONDUCTOR STRUCTURE" and filed on Jan. 18, 2022. The entire contents of International Application No. PCT/CN2022/078996 and Chinese Patent Application No. 202210052781.3 are incorporated herein by reference.

TECHNICAL FIELD

The present disclosure relates to, but is not limited to, a method of manufacturing a semiconductor structure and a semiconductor structure.

BACKGROUND

A dynamic random access memory (DRAM) is a semiconductor memory that randomly writes and reads data at high speed, and is widely used in data storage devices or apparatuses. The DRAM includes a plurality of memory cells arranged repeatedly.

As electronic products are increasingly becoming lighter, thinner, shorter, and smaller, components of the DRAM are also designed toward the trend of high integration, high density, and miniaturization. A semiconductor structure is required to be finer, with a large quantity of dense repetitive patterns. An etching process with high etching quality requirements is required for consistency in sizes of etched memory cells. However, charge leakage, pattern breakage, and other problems exist in a process of etching a large quantity of small-sized array patterns, reducing performance and a yield of the semiconductor structure.

SUMMARY

An overview of the subject matter detailed in the present disclosure is provided below, which is not intended to limit the protection scope of the claims.

The present disclosure provides a method of manufacturing a semiconductor structure and a semiconductor structure.

A first aspect of the present disclosure provides a method of manufacturing a semiconductor structure, including:
providing a base, a plurality of active regions being arranged in the base, and the plurality of active regions being arranged at intervals along a first direction;
forming a plurality of bit line structures on the base, the plurality of bit line structures being arranged at intervals along the first direction;
forming a contact structure between two adjacent ones of the bit line structures; forming, on the contact structure, a plurality of barrier structures arranged at intervals along the first direction, the barrier structures being arranged in correspondence with and connected to the bit line structures, and a first recess being formed between any two adjacent ones of the barrier structures; and
forming a conductive structure in the first recess, the conductive structure comprising a protective layer and a conductive portion, and the protective layer wrapping a sidewall and a bottom wall of the conductive portion.

A second aspect of the present disclosure provides a semiconductor structure, including:
a base, a plurality of active regions being arranged in the base, and the plurality of active regions being arranged at intervals along a first direction;
a plurality of bit line structures, the plurality of bit line structures being provided on the base and connected to the active region, and the plurality of bit line structures being arranged at intervals along the first direction;
a plurality of contact structures, the plurality of contact structures being provided on the base and located between two adjacent ones of the bit line structures;
a plurality of barrier structures, located above the contact structure, the barrier structures being arranged in correspondence with and connected to the bit line structure; and
a plurality of conductive structures, provided on the contact structure and electrically connected to the contact structure, each conductive structure and each barrier structure being arranged at intervals, the conductive structure including a protective layer and a conductive portion, and the protective layer wrapping a sidewall and a bottom wall of the conductive portion.

Other aspects of the present disclosure are understandable upon reading and understanding of the accompanying drawings and detailed description.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are is part rather than all of the embodiments of the present disclosure. Those skilled in the art may derive other accompanying drawings based on these accompanying drawings without creative efforts.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

A DRAM is a semiconductor memory that randomly writes and reads data at high speed, and is widely used in data storage devices or apparatuses. The DRAM includes a plurality of memory cells arranged repeatedly.

As electronic products are increasingly becoming lighter, thinner, shorter, and smaller, components of the DRAM are also designed toward the trend of high integration, high density, and miniaturization. A semiconductor structure is required to be finer, with a large quantity of dense repetitive patterns. An etching process with high etching quality requirements is required for consistency in sizes of etched memory cells. However, in a process of etching a large quantity of small-sized array patterns, there are metal residues in an etched metal layer of intermediate array patterns.

In a semiconductor structure, no protective layer is provided between metal elements such as tungsten in adjacent metal layers, or only part of a protective layer is provided for etching protection of the metal elements. However, the element tungsten is relatively active and can easily infiltrate the dielectric in a case of a voltage difference or a high temperature to form a tungsten whisker, resulting in electric leakage and charge leakage. Severe electric leakage leads to tungsten burnout, causing a direct short circuit of the semiconductor structure. On the other hand, if intensity of etched metal is increased, metal that needs to be retained next to the metal residue is etched away due to fineness of the pattern layer, causing pattern breakage and reducing performance and a yield of the semiconductor structure.

In order to resolve one of the foregoing technical problems, an exemplary embodiment of the present disclosure provides a method of manufacturing a semiconductor structure. The following describes the method of manufacturing a semiconductor structure with reference to FIG. 1 to FIG. 13.

The semiconductor structure is not limited in this embodiment. The semiconductor structure is described below by using a DRAM as an example, but this embodiment is not limited thereto. Alternatively, the semiconductor structure in this embodiment may be other structures.

Figure 1:
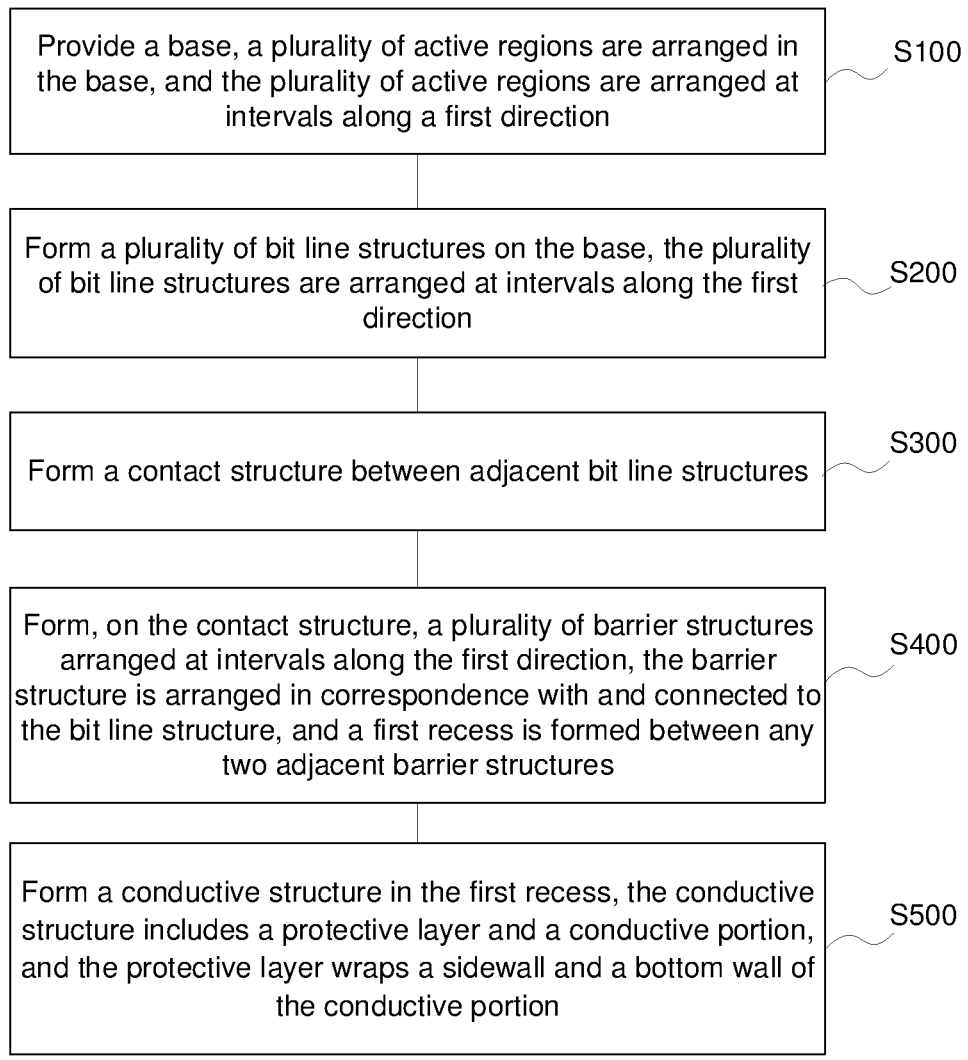
FIG. 1 is a flowchart of a method of manufacturing a semiconductor structure according to an exemplary embodiment.

As shown in FIG. 1, an exemplary embodiment of the present disclosure provides the method of manufacturing a semiconductor structure, including the following steps:

Step S100: Provide a base, a plurality of active regions are arranged in the base, and the plurality of active regions are arranged at intervals along a first direction.

Step S200: Form a plurality of bit line structures on the base, the plurality of bit line structures are arranged at intervals along the first direction.

Step S300: Form a contact structure between adjacent bit line structures.

Step S400: Form, on the contact structure, a plurality of barrier structures arranged at intervals along the first direction, the barrier structure is arranged in correspondence with and connected to the bit line structure, and a first recess is formed between any two adjacent barrier structures.

Step S500: Form a conductive structure in the first recess, the conductive structure includes a protective layer and a conductive portion, and the protective layer wraps a sidewall and a bottom wall of the conductive portion.

In this embodiment, the conductive structure is formed through the foregoing steps, and a specific implementation method and structure for forming the conductive structure are not specifically limited, provided that it can be ensured that the protective layer of the conductive structure wraps the sidewall and the bottom wall of the conductive structure.

In this embodiment, the protective layer is formed on the sidewall and the bottom wall is of the conductive portion to protect the conductive portion by using the protective layer, such that etching parameters in the etching process can be improved to prevent metal residues, thereby avoiding a case of electric leakage or short circuit in the semiconductor structure, thus improving performance and a yield of the semiconductor structure.

According to an exemplary embodiment, this embodiment is a further description of step S100 above. The following describes in detail the implementation method of step S100 in this embodiment which is reference to related accompanying drawings.

Figure 2:
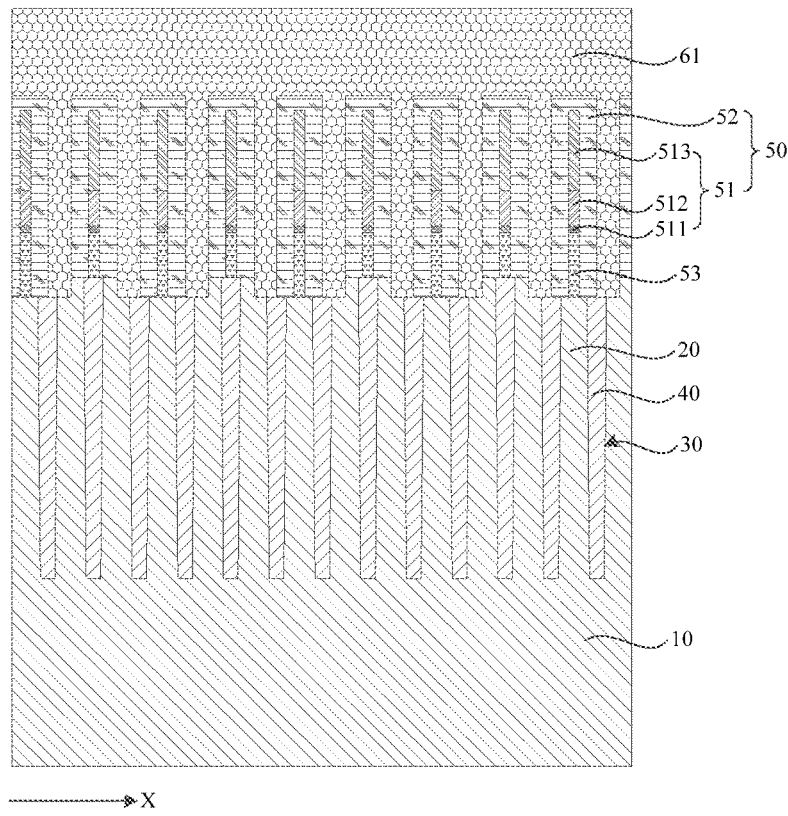
FIG. 2 is a schematic diagram of forming an initial contact structure and a sidewall layer of a single-layer structure in a method of manufacturing a semiconductor structure according to an exemplary embodiment.

As shown in FIG. 2, a base 10 is provided. The base 10 serves as a support component of the DRAM and is used to support other components provided thereon. The base 10 may be made of a semiconductor material. The semiconductor material may be one or more of silicon, germanium, a silicon-germanium compound, and a silicon-carbon compound. In this embodiment, the base 10 is made of silicon. The use of silicon as the base 10 in this embodiment is to facilitate the understanding of the subsequent forming method by those skilled in the art, rather than to constitute a limitation. In an actual application process, an appropriate material of the base 10 may be selected according to needs.

Referring to FIG. 2, a plurality of active regions 20 are arranged in the base 10, the plurality of active regions 20 being arranged at intervals along a first direction X. Referring to FIG. 2, using an orientation shown in the figure as an example, the first direction X is an extension direction parallel to a front side face of the base 10.

In some embodiments, the active region 20 may be formed by using the following method:

Referring to FIG. 2, a photoresist layer and a mask layer that are stacked are deposited on a top surface of the base 10 through an atomic layer deposition process, a physical vapor deposition process, or a chemical vapor deposition process. A mask pattern is formed on the photoresist layer through exposure or development etching. The photoresist layer with the mask pattern is used as a mask to etch and remove part of the photoresist layer and part of the mask layer. In this way, a plurality of isolation trenches 30 arranged at intervals along the first direction X are formed on the base 10. Subsequently, the remaining photoresist layer and mask layer are removed by using an is etching process. Then, an isolation structure 40 is deposited in the isolation trench 30 by using the atomic layer deposition process, the physical vapor deposition process, or the chemical vapor deposition process. The base 10 between two adjacent isolation structures 40 forms the active region 20. The isolation structure 40 may be made of an insulating material, such as silicon dioxide or silicon oxynitride.

In this embodiment, the isolation structure 40 may serve as a barrier isolation layer that can insulatively isolate a plurality of active regions 20, and can also avoid a subsequent case such as current leakage from a sidewall layer of the semiconductor structure, thereby ensuring the performance and yield of the semiconductor structure.

According to an exemplary embodiment, this embodiment is a further description of step S200 above. The following describes in detail the implementation method of step S200 in this embodiment which is reference to related accompanying drawings.

As shown in FIG. 2, in some embodiments, a plurality of bit line structures 50 are formed on the base 10, the plurality of bit line structures 50 being arranged at intervals along the first direction X.

It should be noted that, before the bit line structures 50 are formed, a plurality of bit line contacts 53 arranged at intervals along the first direction X may be first formed on the base 10. In an example, the bit line contacts 53 may be formed by forming through holes by using an etching process and then depositing a contact material in the through holes.

In another example, the bit line structures 50 may be formed by using the following method:

A first initial conductive layer, a second initial conductive layer, and an initial isolation layer (not shown in the figure) are sequentially deposited on the base 10 by using an atomic layer deposition process, a physical vapor deposition process, or a chemical vapor deposition process.

Subsequently, the first initial conductive layer, the second initial conductive layer, and the initial isolation layer are patterned, such that a plurality of first trenches (not shown in the figure) arranged at intervals along the first direction X are formed on the first initial conductive layer, the second initial conductive layer, and the initial isolation layer.

Then, a sidewall layer 52 is formed on a sidewall of the first trench by using the is atomic layer deposition process, the first initial conductive layer that is retained forms a first conductive layer 511, the second initial conductive layer that is retained forms a second conductive layer 512, and the initial isolation layer that is retained forms an isolation layer 513. The first conductive layer 511, the second conductive layer 512, and the isolation layer 513 that are stacked along the first direction X form a bit line 51. In this embodiment, the sidewall layer 52 is arranged on a sidewall of the first conductive layer 511, a sidewall of the second conductive layer 512, and a sidewall and a top surface of the isolation layer 513. The bit line 51 and the sidewall layer 52 form a bit line structure 50, that is, the sidewall layer 52 is part of the bit line structure 50.

A material of the first conductive layer 511 may include, but is not limited to, tungsten, polycrystalline silicon, and the like. A material of the second conductive layer 512 may include, but is not limited to, polycrystalline silicon, titanium nitride, tungsten, and the like.

In this embodiment, the sidewall layer 52 is formed by using the atomic layer deposition process. The atomic layer deposition process is characterized by a low deposition rate, high density of a deposited film layer, and good step coverage. The sidewall layer 52 formed by using the atomic layer deposition process can isolate and protect the bit line structure 50 when the sidewall layer 52 is relatively thin, so as to avoid occupying a large space, thereby facilitating subsequent implementation of filling or formation of another structure layer.

Figure 3:
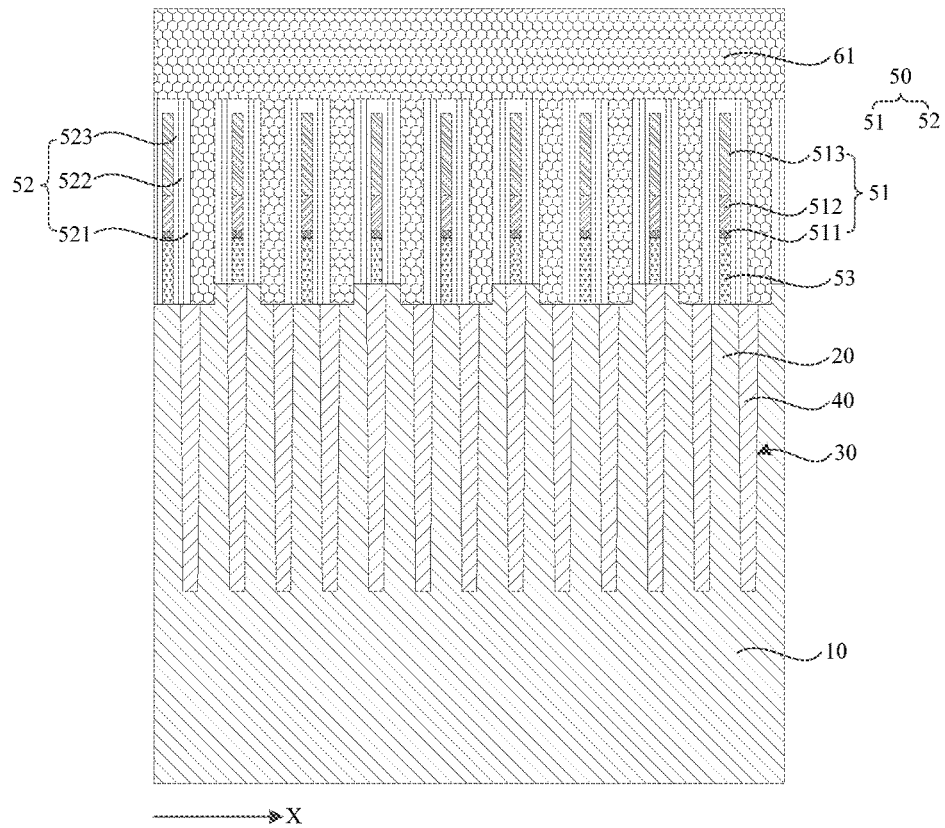
FIG. 3 is a schematic diagram of forming an initial contact structure and a sidewall layer of a multi-layer structure in a method of manufacturing a semiconductor structure according to an exemplary embodiment.

It should be noted that, referring to FIG. 2 and FIG. 3, in some embodiments, the sidewall layer 52 may be of a single-layer structure, or may be of a multi-layer structure. When the sidewall layer 52 is of single layer structure, a material of the sidewall layer 52 may include, but is not limited to, isolation materials such as silicon dioxide, borophosphosilicate glass, silicon nitride, or silicon oxynitride. When the sidewall layer 52 is of a multi-layer structure, the sidewall layer 52 may include a first sidewall layer 521, a second sidewall layer 522, and a third sidewall layer 523. The first sidewall layer 521, the second sidewall layer 522, and the third sidewall layer 523 may be made of the same material or different materials. In an example, the materials of the first sidewall layer 521, the second sidewall layer 522, and the third sidewall layer 523 may include isolation materials such as silicon dioxide and borophosphosilicate glass, so as to isolate the bit is line structure 50, a subsequently formed contact structure, and other structures. In another example, the first sidewall layer 521, the second sidewall layer 522, and the third sidewall layer 523 may include silicon nitride or silicon oxide, so as to form an "NON" structure, for example, a silicon nitride layer, a silicon oxide layer, and a silicon nitride layer, where "O" represents silicon oxide, and "N" represents silicon nitride. Due to different directions of stress generated by a silicon oxide layer and a silicon nitride layer, use of the "NON" structure helps reduce the stress and improve isolation performance of the sidewall layer 52, and facilitates selective etching in a subsequent structure, thereby ensuring and improving performance of the semiconductor structure.

According to an exemplary embodiment, this embodiment is a further description of step S300 above. The following describes in detail the implementation method of step S300 in this embodiment which is reference to related accompanying drawings.

Figure 4:
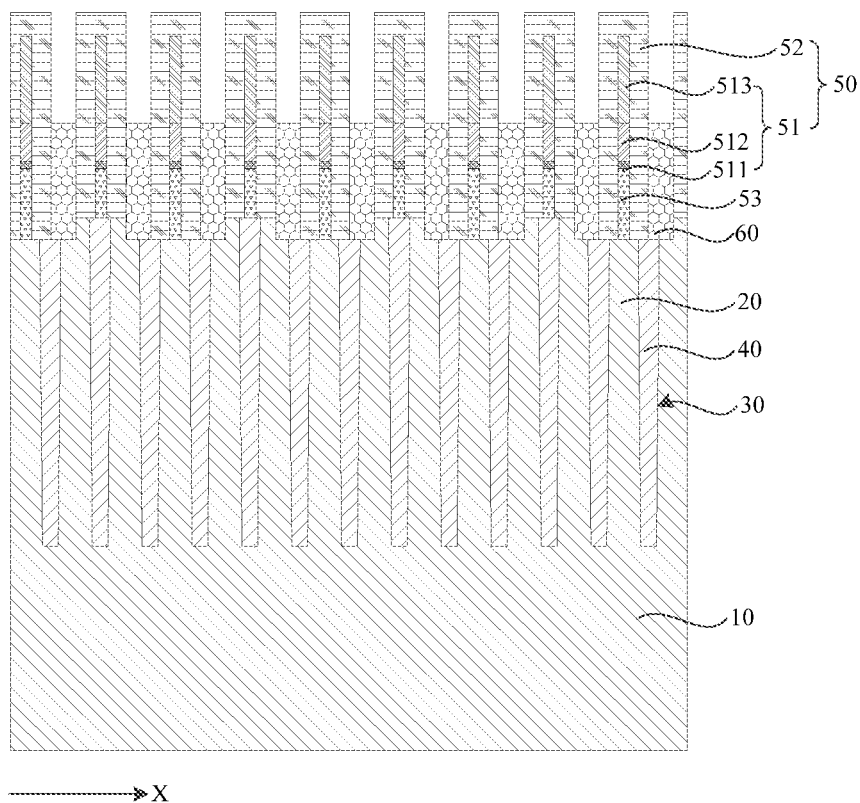
FIG. 4 is a schematic diagram of forming a contact structure in a method of manufacturing a semiconductor structure according to an exemplary embodiment.

As shown in FIG. 2 and FIG. 4, to form a contact structure 60 between adjacent bit line structures 50, an initial contact structure 61 may be first formed between and on the adjacent bit line structures 50.

Subsequently, part of the initial contact structure 61 is removed, and the initial contact structure 61 that is retained forms the contact structure 60. A top surface of the contact structure 60 is lower than a top surface of the bit line structure 50. The contact structure 60 may be a capacitor contact structure.

After the bit line structure 50 is formed, a contact hole (not shown in the figure) is formed between the adjacent bit line structures 50. Subsequently, an initial contact structure 61 is deposited in the contact hole by using an atomic layer deposition process, a chemical vapor deposition process, or a physical vapor deposition process. The initial contact structure 61 fills the entire contact hole, extends to the outside of the contact hole, and covers the top surface of the bit line structure 50.

Then, part of the initial contact structure 61 is removed through an etching process. The initial contact structure 61 that is retained forms the contact structure 60. That is, the top surface of the contact structure 60 is lower than the top surface of the bit line structure 50. It should be noted that, in an example, the top surface of the contact structure 60 may be flush with a top surface of the first conductive layer 511 or the second conductive layer 512 in the bit line structure 50, or with a direction from the bottom surface of the base 10 to the top surface of the base 10 as an extension direction, the top surface of the contact structure 60 may be flush with any position of the first conductive layer 511 or the second conductive layer 512 along the extension direction.

In this embodiment, the top surface of the contact structure 60 is flush with the top surface of the isolation layer 513 in the bit line structure 50, and the sidewall layer 52 is used for insulation isolation between the contact structure 60 and the bit line 51, so as to ensure a distance between the contact structure 60 and the adjacent bit line 51, thereby reducing impact on a parasitic capacitance of the bit line 51. A material of the contact structure 60 may include, but is not limited to, polycrystalline silicon, titanium nitride, tungsten, or the like, so as to ensure electrical conductivity between the active region 20 and a subsequently formed semiconductor structure.

As shown in FIG. 2, in some embodiments, projection of the contact structure 60 on the base 10 partially overlaps projection of the active region 20 on the base 10, thereby facilitating alignment between the contact structure 60 and the active region 20.

It should be noted that, in an example, along the first direction X, a horizontal width of the contact structure 60 is greater than a horizontal width of the bit line structure 50, thereby making the alignment between the contact structure 60 and the active region 20 easier.

Figure 5:
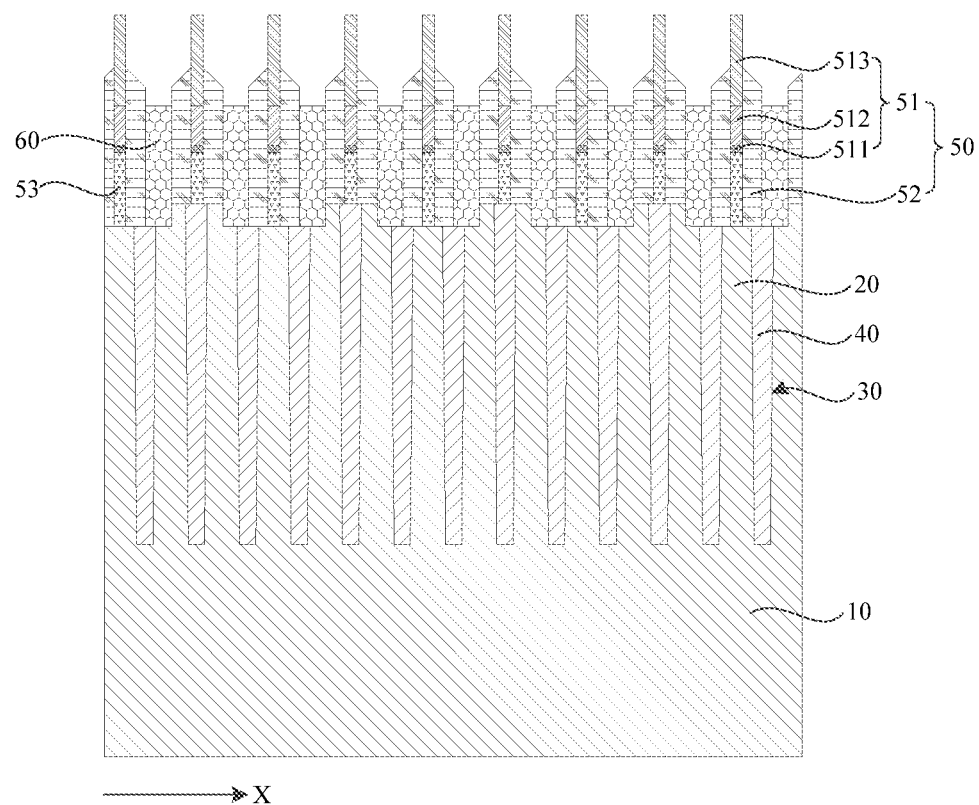
FIG. 5 is a schematic diagram of removing part of a sidewall layer in a method of manufacturing a semiconductor structure according to an exemplary embodiment.

As shown in FIG. 5, in some embodiments, after the contact structure 60 is formed, the sidewall layer 52 that covers the top surface of the isolation layer 513 and part of the sidewall of the isolation layer 513 is etched and removed, such that a barrier layer is subsequently formed on the sidewall and part of the top surface of the isolation layer 513, thereby providing a good adhesion basis for subsequent formation of a conductive structure.

According to an exemplary embodiment, this embodiment is a further description of step S400 above. The following describes in detail the implementation method of step S400 in this embodiment which is reference to related accompanying drawings.

Figure 6:
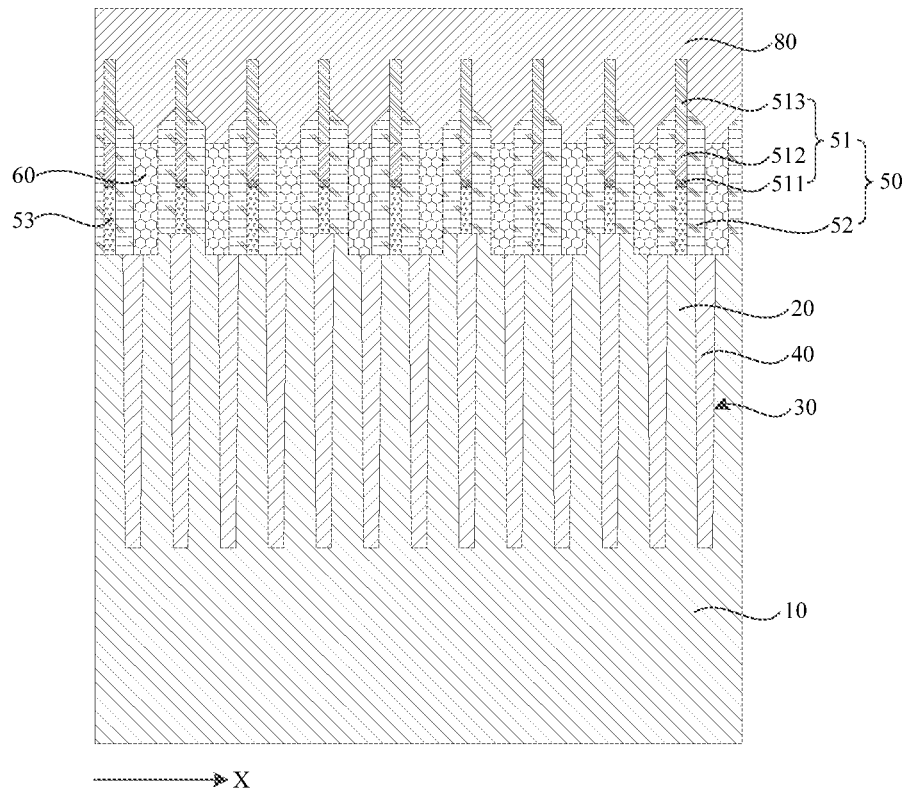
FIG. 6 is a schematic diagram of forming a dielectric layer in a method of manufacturing a semiconductor structure according to an exemplary embodiment.
Figure 7:
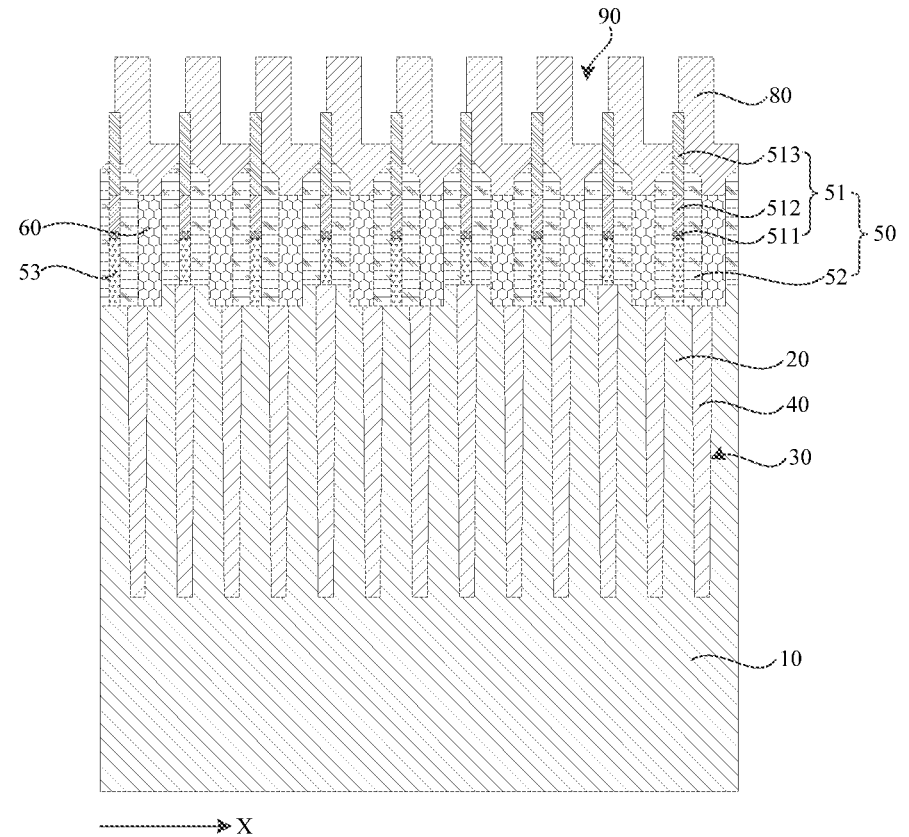
FIG. 7 is a schematic diagram of forming a third recess in a method of manufacturing a semiconductor structure according to an exemplary embodiment.
Figure 8:
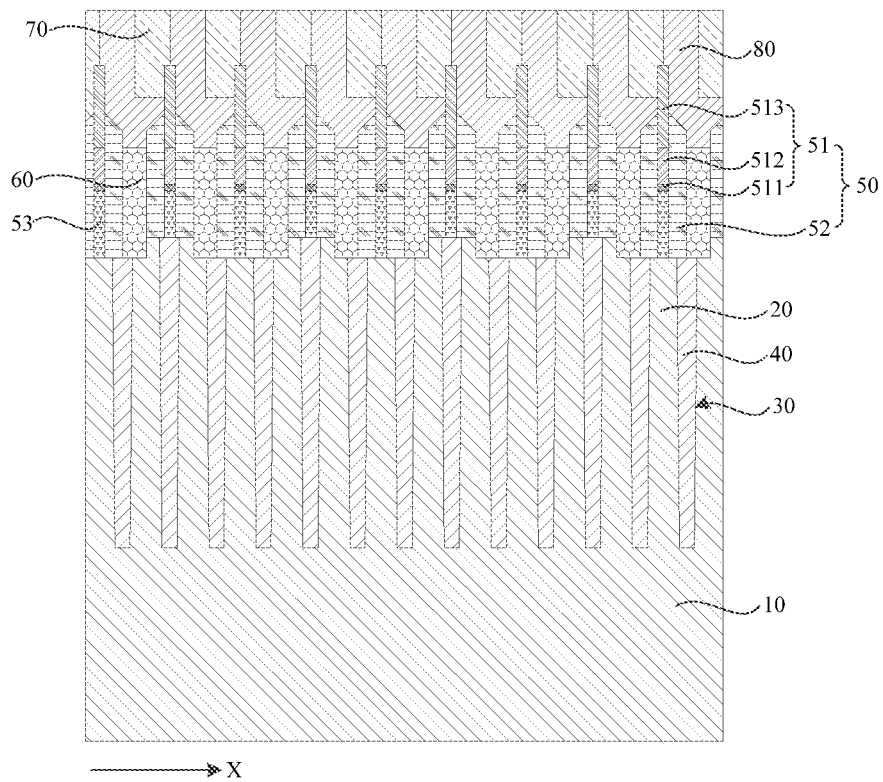
FIG. 8 is a schematic diagram of forming a barrier structure in a method of manufacturing a semiconductor structure according to an exemplary embodiment.
Figure 9:
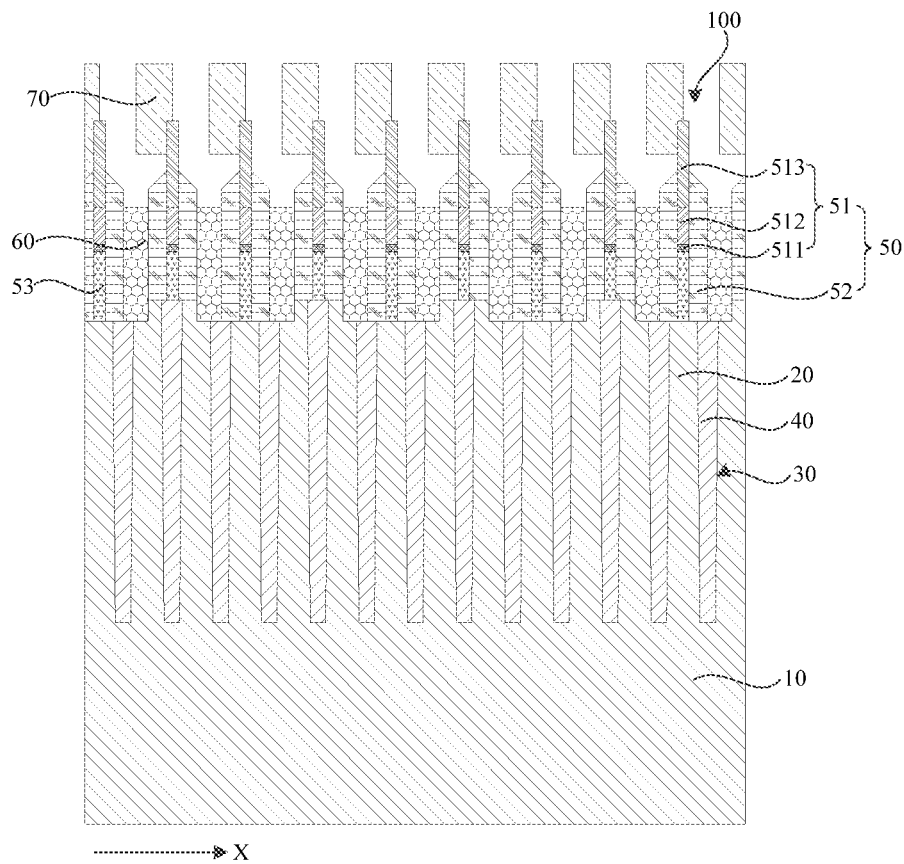
FIG. 9 is a schematic diagram of forming a first recess in a method of manufacturing a semiconductor structure according to an exemplary embodiment.

As shown in FIG. 6 to FIG. 8, in some embodiments, a plurality of barrier structures 70 arranged at intervals along the first direction X are formed on the contact structure 60. The plurality of barrier structures 70 are provided in a one-to-one correspondence with the plurality of bit line structures 50, and any one of the barrier structures 70 is connected to the corresponding bit line structure 50.

Referring to FIG. 6 to FIG. 8, in some embodiments, the barrier structure 70 may be formed by using the following method:

A dielectric layer 80 is formed on the bit line structure 50 and the contact structure 60 by using an atomic layer deposition process, a physical vapor deposition process, or a chemical vapor deposition process. A top surface of the dielectric layer 80 is higher than the top surface of the bit line structure 50. A material of the dielectric layer 80 may include, but is not limited to, silicon nitride, silicon dioxide, silicon oxynitride, borophosphosilicate glass or the like.

After the dielectric layer 80 is formed, the dielectric layer 80 is patterned to form, on the dielectric layer 80, a plurality of third recesses 90 arranged at intervals. The third recess 90 is located between two adjacent bit line structures 50, and the third recess 90 exposes part of the sidewall and part of the top surface of the bit line structure 50 on one side.

Subsequently, a barrier structure 70 is deposited in the third recess 90 by using the atomic layer deposition process, the physical vapor deposition process, or the chemical vapor deposition process.

Then, the remaining dielectric layer 80 is etched and removed, that is, the dielectric layer 80 between any two adjacent barrier structures 70 is removed, to form a first recess 100 between the adjacent barrier structures 70. The first recess 100 exposes the top surface of the contact structure 60, to facilitate subsequent formation of a conductive structure 110 in the first recess 100.

In an example, the material of the dielectric layer 80 may be deposited from borophosphosilicate glass, and the dielectric layer 80 formed by this material can be easily removed in a subsequent manufacturing process. Therefore, the remaining dielectric layer 80 can be removed by wet etching. Use of a wet etching process with a high selectivity can appropriately increase an etching time, such that the remaining dielectric layer 80 can be completely removed, thereby ensuring that the barrier structure 70 and the bit line structure 50 are not damaged while the dielectric layer 80 is completely removed, thus preventing wire breakage.

It should be noted that, referring to FIG. 8, the barrier structure 70 is deposited in the third recess 90. In an example, an initial barrier structure (not shown in the figure) is deposited in the third recess 90 and on the bit line structure 50 and the dielectric layer 80, part of the initial barrier structure is removed, and the initial barrier structure that is retained forms the barrier structure 70. A top surface of the barrier structure 70 is flush with the top surface of the dielectric layer 80. A material of the initial barrier structure may include, but is not limited to, silicon nitride. After the barrier structure is caused to be deposited, the initial barrier structure is partially removed, to ensure a height dimension of the barrier structure 70, and to facilitate subsequent formation of another semiconductor structure on the barrier structure 70, thereby ensuring the performance and yield of the semiconductor structure.

According to an exemplary embodiment, this embodiment is a further description of step S500 above. The following describes in detail the implementation method of step S500 in this embodiment which is reference to related accompanying drawings.

As shown in FIG. 9 to FIG. 12, after the barrier structure 70 is formed, a conductive structure 110 is formed in the first recess 100. The conductive structure 110 includes a protective layer 111 and a conductive portion 112. The protective layer 111 wraps a sidewall and a bottom wall of the conductive portion 112.

Referring to FIG. 9 to FIG. 12, in some embodiments, the conductive structure 110 may be formed by using the following method:

The protective layer 111 is formed in the first recess 100 by using a deposition process. The protective layer 111 covers a bottom surface and a sidewall of the first recess 100. The protective layer 111 in the first recess 100 forms a second recess 120. A material of the protective layer 111 may include, but is not limited to, titanium nitride, tantalum nitride, titanium, tantalum, or the like.

Subsequently, the second recess 120 is filled with a conductive material by using the deposition process, to form the conductive portion 112. The conductive material may include, but is not limited to, tungsten, polycrystalline silicon, or the like.

In this embodiment, the protective layer 111 is first formed on the sidewall and the bottom surface of the first recess 100. Subsequently, the conductive portion 112 is formed on the protective layer 111. The protective layer 111 is used to effectively perform isolation protection on the conductive portion 112, thereby avoiding electric leakage or a short circuit caused by a tungsten whisker generated by the conductive material such as metal tungsten in the conductive portion 112. On the other hand, the foregoing formation method of the conductive structure 110 is easy to control. In the formation method, a molding shape and a formation size of the conductive portion 112 can also be effectively controlled, thereby improving the performance and yield of the semiconductor structure.

Figure 10:
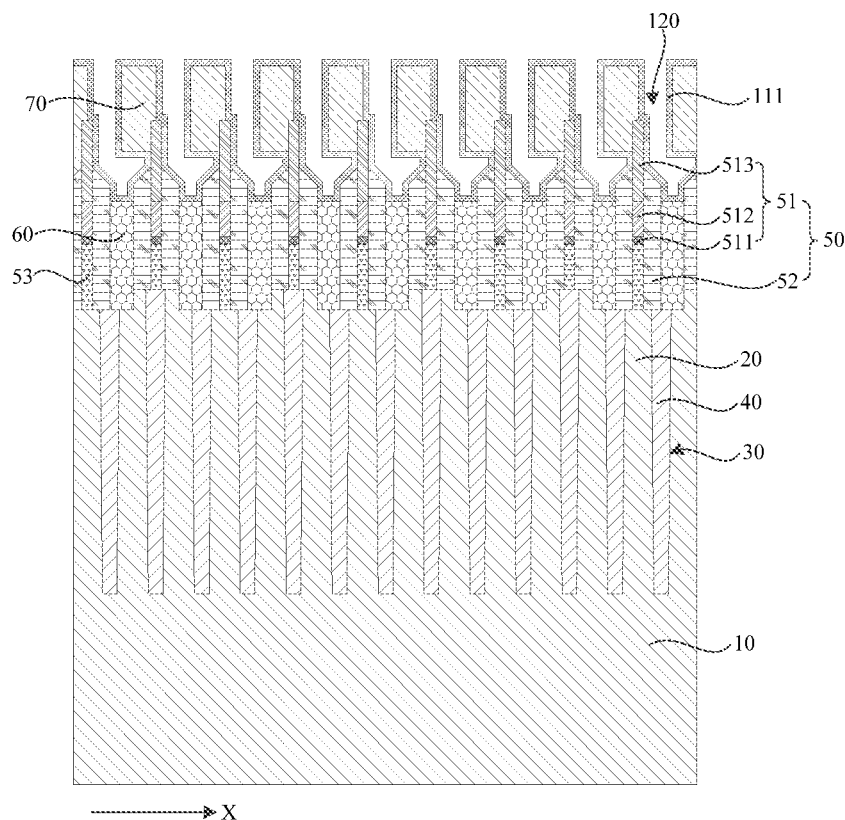
FIG. 10 is a schematic diagram of forming a protective layer in a method of manufacturing a semiconductor structure according to an exemplary embodiment.

As shown in FIG. 10, in some embodiments, the protective layer 111 may be deposited by using an atomic layer deposition process. The atomic layer deposition process is characterized by a low deposition rate, high density of a deposited film layer, and good step coverage. The protective layer 111 formed by using the atomic layer deposition process can effectively isolate and protect the conductive portion 112 when the protective layer 111 is relatively thin, and can avoid occupying a large space, thereby facilitating subsequent implementation of filling or formation of another structure layer.

Figure 11:
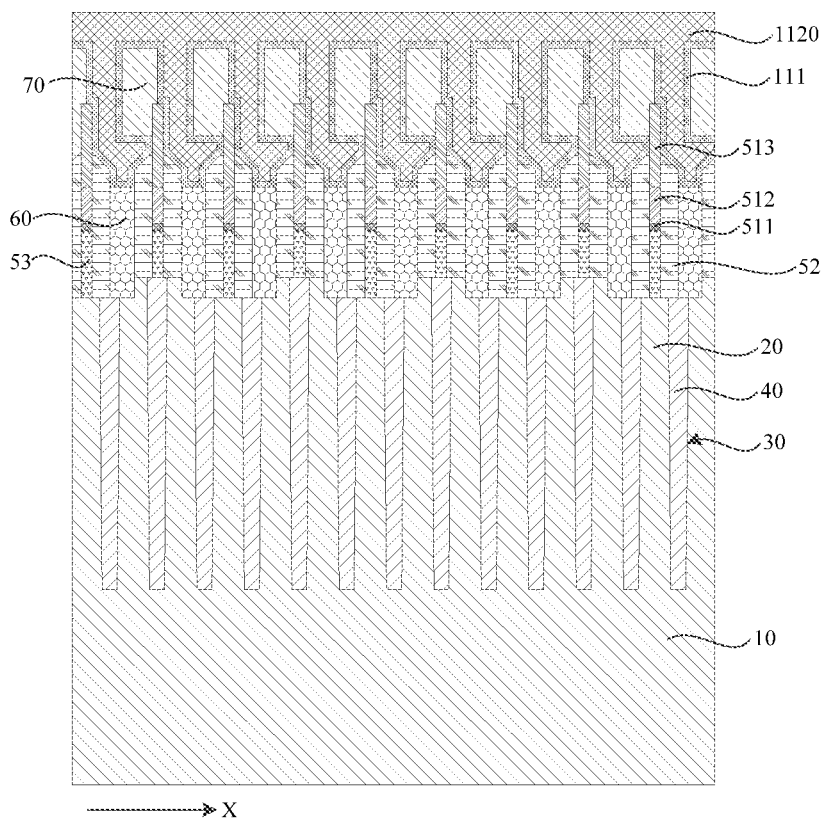
FIG. 11 is a schematic diagram of forming an initial conductive portion in a method of manufacturing a semiconductor structure according to an exemplary embodiment.
Figure 12:
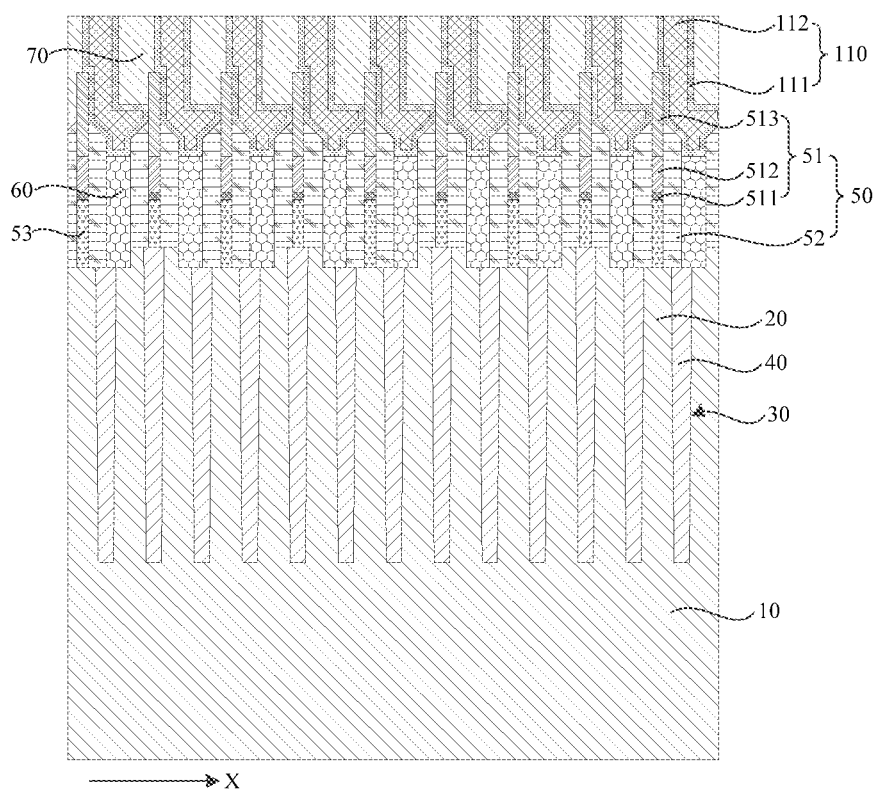
FIG. 12 is a schematic diagram of forming a conductive portion and a conductive structure in a method of manufacturing a semiconductor structure according to an exemplary embodiment.

As shown in FIG. 11 and FIG. 12, in some embodiments, the conductive portion 112 may be formed by using the following method:

The second recess 120 is filled with a conductive material by using the atomic layer deposition process, the physical vapor deposition process, or the chemical vapor deposition process. The conductive material covers a surface of the protective layer 111 and fills the second recess 120. In other words, the conductive material is equivalent to forming an initial conductive portion 1120. The initial conductive portion 1120 fills the entire second recess 120, and then covers a top surface of the protective layer 111 on the top surface of the barrier structure 70.

Subsequently, part of the initial conductive portion 1120 and part of the protective layer 111 are removed through chemical mechanical polishing, to expose the top surface of the barrier structure 70. That is, the top surface of the initial conductive portion 1120 that is retained is flush with the top surface of the barrier structure 70, and forms the conductive portion 112, and the top surface of the protective layer 111 that is retained is is flush with the top surface of the barrier structure 70.

In this embodiment, the initial conductive portion 1120 is formed on the surface of the protective layer 111, and part of the initial conductive portion 1120 and part of the protective layer 111 are subsequently removed through chemical mechanical polishing, such that the conductive portion 112 and the top surface of the protective layer 111 that is retained are flush with the top surface of the barrier structure 70, thereby effectively controlling formation quality and a formation shape of the conductive portion 112, and improving the performance and yield of the semiconductor structure.

As shown in FIG. 12, in some embodiments, with a plane parallel to the first direction X as a cross section, a cross-sectional shape of the conductive portion 112 includes a Z shape, an L shape, and an inverted L shape. The conductive portion 112 with the foregoing cross-sectional shape such as the Z shape, the L shape, or the inverted L shape facilitates staggered arrangement of other subsequently formed semiconductor structure components, thereby improving a formation size or a formation volume of the semiconductor structure.

Figure 13:
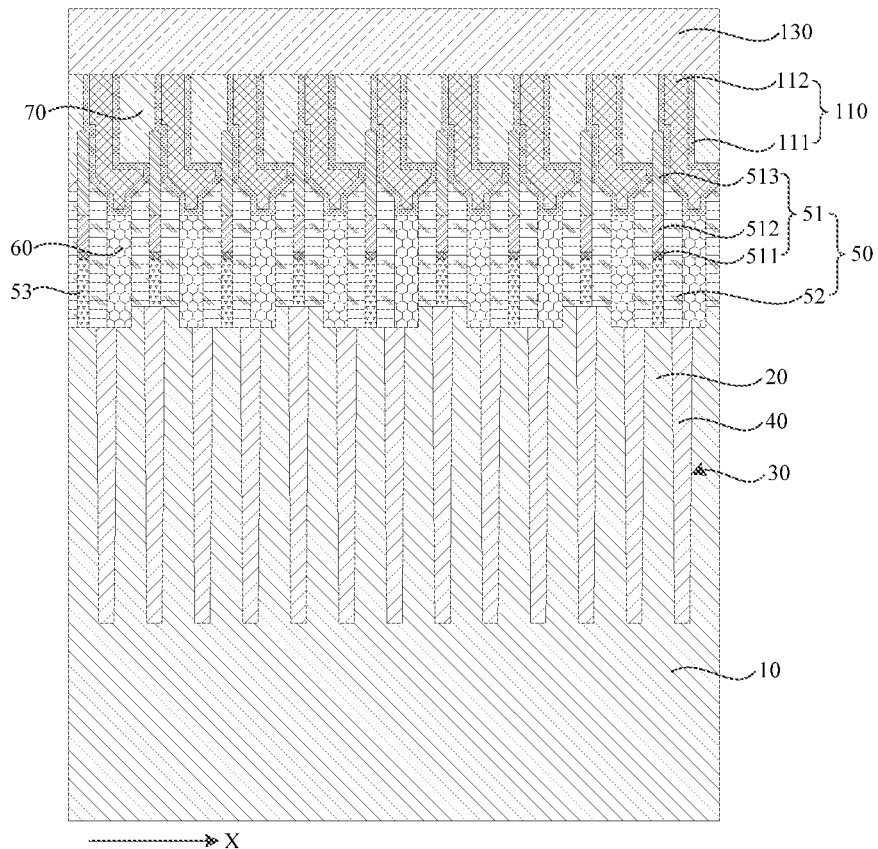
FIG. 13 is a schematic diagram of forming an insulating layer in a method of manufacturing a semiconductor structure according to an exemplary embodiment.

As shown in FIG. 13, in some embodiments, after the conductive structure 110 is formed, an insulating layer 130 is formed on the conductive structure 110 by using an atomic layer deposition process, a physical vapor deposition process, or a chemical vapor deposition process, to facilitate subsequent formation of other structures of the semiconductor structure on the conductive structure 110 or the insulating layer 130.

As shown in FIG. 13, an exemplary embodiment of the present disclosure provides a semiconductor structure. The semiconductor structure includes: a base 10, bit line structures 50, contact structures 60, barrier structures 70, and conductive structures 110.

A plurality of active regions 20 are arranged in the base 10, the plurality of active regions 20 being arranged at intervals along a first direction X. In this embodiment, any two adjacent active regions 20 are insulated from each other by an isolation structure 40.

There are a plurality of bit line structures 50, and the plurality of bit line structures 50 are arranged at intervals on the base 10 along the first direction X. The plurality of bit line structures 50 are provided in a one-to-one correspondence with the plurality of active regions 20. With a direction from a bottom surface of the base 10 to a top surface of the is base 10 as an extension direction, active regions 20 in the same extension direction are connected to bit line structures 50 located above the active region 20 along the extension direction. In an example, the active regions 20 may be connected to the bit line structures 50 through bit line contacts 53.

The contact structures 60 are arranged on the base 10, and there are a plurality of contact structures 60. A contact structure 60 is provided between any two adjacent bit line structures 50.

There are a plurality of barrier structures 70, located above the contact structures 60. The barrier structures 70 are arranged in correspondence with and connected to the bit line structures 50.

The conductive structures 110 are arranged on the contact structure 60. A plurality of conductive structures 110 are arranged in a one-to-one correspondence with the plurality of contact structures 60. The conductive structures 110 are arranged on the contact structures 60 and are electrically connected to the contact structures 60. Each conductive structure 110 and each barrier structure 70 are arranged at intervals. The conductive structure 110 includes a protective layer 111 and a conductive portion 112. The protective layer 111 wraps a sidewall and a bottom wall of the conductive portion 112.

In this embodiment, the protective layer is provided on the sidewall and the bottom wall of the conductive portion to protect the conductive portion by using the protective layer, such that etching parameters in the etching process can be improved to prevent metal residues, thereby avoiding a case of electric leakage or short circuit in the semiconductor structure, thus improving performance and a yield of the semiconductor structure.

As shown in FIG. 13, in some embodiments, projection of the contact structure 60 on the base 10 partially overlaps projection of the active region 20 on the base 10, thereby facilitating alignment between the contact structure 60 and the active region 20.

It should be noted that, referring to FIG. 13, in an example, along the first direction X, a horizontal width of the contact structure 60 is greater than a horizontal width of the bit line structure 50, thereby making the alignment between the contact structure 60 and the active region 20 easier.

As shown in FIG. 13, in some embodiments, with a plane parallel to the first direction X as a cross section, a longitudinal cross-sectional shape of the conductive portion 112 includes a Z shape, an L shape, or an inverted L shape, to facilitate staggered arrangement of other subsequently formed semiconductor structure components, thereby improving a formation size or a formation volume of the semiconductor structure.

As shown in FIG. 13, in an embodiment, the semiconductor structure further includes an insulating layer 130. The insulating layer 130 is arranged on the conductive structure 110 and the top surface of the bit line structure 50, to facilitate subsequent formation of other structures of the semiconductor structure on the conductive structure 110, the bit line structure 50, or the insulating layer 130.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an illustrative embodiment", "some implementations", "an illustrative implementation" and "an example" means that the specific feature, structure, material or feature described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more embodiments or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned device or element must have a specific orientation and must be constructed and operated in a specific orientation. Therefore, these terms should not be construed as a limitation to the present disclosure.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the method of manufacturing a semiconductor structure and the semiconductor structure of the embodiments of the present disclosure, a protective layer is formed on a sidewall and a bottom wall of a conductive portion to protect the conductive portion by using the protective layer, to prevent a problem of electric leakage or short circuit caused by metal residues in an etching process, thereby improving performance and a yield of the semiconductor structure.

The invention claimed is:

1. A method of manufacturing a semiconductor structure, comprising:
   providing a base, a plurality of active regions being arranged in the base, and the plurality of active regions being arranged at intervals along a first direction;
   forming a plurality of bit line structures on the base, the plurality of bit line structures being arranged at intervals along the first direction;
   forming a contact structure between two adjacent ones of the bit line structures;
   forming, on the contact structure, a plurality of barrier structures arranged at intervals along the first direction, the barrier structure being arranged in correspondence with and connected to the bit line structure, and a first recess being formed between any two adjacent ones of the barrier structures; and
   forming a conductive structure in the first recess, the conductive structure comprising a protective layer and a conductive portion, and the protective layer wrapping a sidewall and a bottom wall of the conductive portion;
   wherein the forming a plurality of bit line structures on the base comprises:
   sequentially depositing a first initial conductive layer, a second conductive initial layer, and an initial isolation layer on the base;
   patterning the initial first conductive layer, the second initial conductive layer, and the initial isolation layer, so that the retained first initial conductive layer forms a first conductive layer, the retained second initial conductive layer forms a second conductive layer, and the retained initial isolation layer forms an isolation layer; and
   forming a sidewall layer on a sidewall of the first conductive layer, a sidewall of the second conductive layer, and a sidewall and a top surface of the isolation layer;
   after forming the contact structure, the method further comprises:
   removing the sidewall layer that covers the top surface of the isolation layer and part of the sidewall of the isolation layer;
   wherein each of the barrier structures is in contact with part of the sidewall of the isolation layer and part of the top surface of the isolation layer.

2. The method of manufacturing the semiconductor structure according to claim 1, wherein the forming a conductive structure in the first recess comprises:
  forming the protective layer in the first recess, wherein the protective layer covers a bottom surface and a sidewall of the first recess, and the protective layer in the first recess forms a second recess; and
  filling the second recess with a conductive material, and forming the conductive portion.

3. The method of manufacturing the semiconductor structure according to claim 1, wherein with a plane parallel to the first direction as a cross section, a cross section of the conductive portion is Z-shaped, L-shaped, or inverted L-shaped.

4. The method of manufacturing the semiconductor structure according to claim 2, wherein the forming the protective layer in the first recess comprises:
  forming the protective layer in the first recess by using an atomic layer deposition process.

5. The method of manufacturing the semiconductor structure according to claim 2, wherein the filling the second recess with a conductive material, and forming the conductive portion comprises:
  filling the second recess with the conductive material, wherein the conductive material covers a surface of the protective layer and fills the second recess; and
  removing part of the protective layer and part of the conductive material to form the conductive portion, and expose a top surface of the barrier structure, wherein a top surface of the conductive portion and a top surface of the protective layer are flush with the top surface of the barrier structure.

6. The method of manufacturing the semiconductor structure according to claim 1, wherein the forming, on the contact structure, a plurality of barrier structures arranged at intervals along the first direction comprises:
  forming a dielectric layer on the bit line structure and the contact structure, wherein a top surface of the dielectric layer is higher than a top surface of the bit line structure;
  patterning the dielectric layer, and forming a third recess between two adjacent bit line structures, wherein the third recess exposes part of a sidewall and part of a top surface of the bit line structure;
  forming the barrier structure in the third recess; and
  removing the dielectric layer, and forming the first recess, wherein the first recess exposes a top surface of the contact structure.

7. The method of manufacturing the semiconductor structure according to claim 6, wherein a projection of the contact structure on the base partially overlaps a projection of the active region on the base.

8. The method of manufacturing the semiconductor structure according to claim 1, wherein the providing a base, a plurality of active regions being arranged in the base, and the plurality of active regions being arranged at intervals along a first direction comprises:
  forming, in the base, a plurality of isolation trenches arranged at intervals; and
  forming an isolation structure in the isolation trench, wherein the base between two adjacent isolation structures forms the active region.

9. The method of manufacturing the semiconductor structure according to claim 1, wherein the forming a contact structure between two adjacent ones of the bit line structures comprises:
  forming an initial contact structure between two adjacent ones of the bit line structures and on the bit line structure; and
  removing part of the initial contact structure to form the contact structure, wherein a top surface of the contact structure is lower than a top surface of the bit line structure.

10. The method of manufacturing the semiconductor structure according to claim 1, further comprising:
  forming an insulating layer on the conductive structure, wherein the insulating layer covers a top surface of the conductive structure.

11. A semiconductor structure, comprising:
  a base, a plurality of active regions being arranged in the base, and the plurality of active regions being arranged at intervals along a first direction;
  a plurality of bit line structures, the plurality of bit line structures being provided on the base and connected to the active region, and the plurality of bit line structures being arranged at intervals along the first direction;
  a plurality of contact structures, the plurality of contact structures being provided on the base and located between two adjacent ones of the bit line structures;
  a plurality of barrier structures, located above the contact structure, the barrier structures being arranged in correspondence with and connected to the bit line structure; and
  a plurality of conductive structures, provided on the contact structure and electrically connected to the contact structure, each conductive structure and each barrier structure being arranged at intervals, the conductive structure comprising a protective layer and a conductive portion, and the protective layer wrapping a sidewall and a bottom wall of the conductive portion;
  wherein the bit line structure comprises:
  a first conductive layer, a second conductive layer, and an isolation layer that are stacked; and
  a sidewall layer on a sidewall of the first conductive layer, a sidewall of the second conductive layer, and a part of a sidewall of the isolation layer;
  wherein each of the barrier structures is in contact with another part of the sidewall of the isolation layer and part of the top surface of the isolation layer.

12. The semiconductor structure according to claim 11, wherein a projection of the contact structure on the base partially overlaps a projection of the active region on the base.

13. The semiconductor structure according to claim 11, wherein with a plane parallel to the first direction as a cross section, a longitudinal cross section of the conductive portion is Z-shaped, L-shaped, or inverted L-shaped.

14. The semiconductor structure according to claim 11, wherein the semiconductor structure further comprises an insulating layer, and the insulating layer is provided on a top surface of the conductive structure and a top surface of the bit line structure.

* * * * *